(12) United States Patent
Cheng et al.

(10) Patent No.: US 12,519,092 B2
(45) Date of Patent: Jan. 6, 2026

(54) LIGHT BOARD AND WHOLE STRUCTURE, AND PLACING METHOD OF LIGHT BOARD PACKAGE

(71) Applicants: K-Tronics (Suzhou) Technology Co., Ltd., Jiangsu (CN); BOE TECHNOLOGY GROUP CO., LTD., Beijing (CN)

(72) Inventors: Xianrong Cheng, Beijing (CN); Wenbo Dong, Beijing (CN)

(73) Assignees: K-Tronics (Suzhou) Technology Co., Ltd., Jiangsu (CN); BOE TECHNOLOGY GROUP CO., LTD., Beijing (CN)

( * ) Notice: Subject to any disclaimer, the term of this patent is extended or adjusted under 35 U.S.C. 154(b) by 166 days.

(21) Appl. No.: 18/263,417

(22) PCT Filed: Jun. 30, 2022

(86) PCT No.: PCT/CN2022/103098
§ 371 (c)(1),
(2) Date: Jul. 28, 2023

(87) PCT Pub. No.: WO2024/000501
PCT Pub. Date: Jan. 4, 2024

(65) Prior Publication Data
US 2025/0006708 A1 Jan. 2, 2025

(51) Int. Cl.
*B65D 73/02* (2006.01)
*B65D 85/68* (2006.01)
(Continued)

(52) U.S. Cl.
CPC .......... *H01L 25/0753* (2013.01); *B65D 85/68* (2013.01); *B65D 2585/6837* (2013.01); *G02F 1/133603* (2013.01)

(58) Field of Classification Search
CPC ......... G02F 1/133603; G02F 1/133608; G02F 1/1336; B65D 85/68; B65D 2585/6837; B65D 73/02; H01L 25/0753; F21V 21/00
(Continued)

(56) References Cited

U.S. PATENT DOCUMENTS 8,894,237 B2 * 11/2014 Kuromizu ......... G02F 1/133608
362/296.01
2005/0281050 A1 * 12/2005 Chou ................ G02F 1/133608
362/612
(Continued)

FOREIGN PATENT DOCUMENTS

CN 101936457 A 1/2011
CN 102818193 A 12/2012
(Continued)

OTHER PUBLICATIONS

PCT International Search Report (w/ English translation) and Written Opinion for corresponding PCT Application No. PCT/CN2022/103098, mailed Mar. 9, 2023, 14 pages.

*Primary Examiner* — Luan K Bui
(74) *Attorney, Agent, or Firm* — Dority & Manning, P.A.

(57) ABSTRACT

A light board and a carrying device thereof are provided. The light board includes a substrate and at least one support pin. The carrying device includes a plurality of carrying plates, and each carrying plate is used for carrying a light board. Every adjacent carrying plate and light board serve as a group of packaging structure. Each carrying plate is provided with a plurality of plate avoidance holes therein, and each substrate is provided with a plurality of substrate avoidance holes therein. In the group of packaging structure, at least one plate avoidance hole and at least one substrate avoidance hole are corresponding and serve as a avoidance hole group, and a support pin of a light board in a group of (Continued)

packaging structure located below passes through an avoidance hole group in at least one group of packaging structure located above.

16 Claims, 10 Drawing Sheets

(51) Int. Cl.
*H01L 25/075* (2006.01)
*G02F 1/13357* (2006.01)
(58) Field of Classification Search
USPC ....... 362/247, 249.01, 296.01; 206/509, 511, 206/557, 558, 722
See application file for complete search history.

(56) References Cited

U.S. PATENT DOCUMENTS

| | | |
|---|---|---|
| 2008/0111937 A1 | 5/2008 | Chen |
| 2009/0135331 A1* | 5/2009 | Kawase ............ G02F 1/133605 362/97.2 |
| 2012/0086884 A1* | 4/2012 | Yoshikawa ....... G02F 1/133608 362/382 |
| 2012/0087122 A1 | 4/2012 | Takeuchi et al. |
| 2012/0262631 A1* | 10/2012 | Kuromizu ......... G02F 1/133608 362/602 |
| 2012/0327311 A1* | 12/2012 | Kuromizu ......... G02F 1/133608 348/739 |
| 2019/0252358 A1 | 8/2019 | Yoo et al. |
| 2019/0360673 A1 | 11/2019 | Seo |
| 2022/0005798 A1 | 1/2022 | Qi et al. |
| 2024/0053634 A1* | 2/2024 | Fang ................ G02F 1/133603 |

FOREIGN PATENT DOCUMENTS

| | | |
|---|---|---|
| CN | 205402421 U | 7/2016 |
| CN | 106875854 A | 6/2017 |
| CN | 207312089 U | 5/2018 |
| CN | 207404239 U | 5/2018 |
| CN | 109250253 A | 1/2019 |
| CN | 110824774 A | 2/2020 |
| CN | 111429817 A | 7/2020 |
| CN | 113109970 A | 7/2021 |
| CN | 113467127 A | 10/2021 |
| CN | 214705918 U | 11/2021 |
| CN | 114236904 A | 3/2022 |
| CN | 114488620 A | 5/2022 |
| JP | 2006261135 A | 9/2006 |
| JP | 2008292886 A | 12/2008 |

* cited by examiner

LIGHT BOARD AND WHOLE STRUCTURE, AND PLACING METHOD OF LIGHT BOARD PACKAGE

CROSS-REFERENCE TO RELATED APPLICATION

This application is a national phase entry under 35 USC 371 of International Patent Application No. PCT/CN2022/103098, filed on Jun. 30, 2022, which is incorporated herein by reference in its entirety.

TECHNICAL FIELD

The present disclosure relates to the packaging field, and in particular, to a light board and a whole structure, and a placing method of light board package.

BACKGROUND

As a new generation of display technology, MLED includes a mini organic light-emitting diode (mini LED) and a micro organic light-emitting diode (micro LED). Compared with a traditional LED, each mini or micro LED die has a smaller size. A display apparatus using a mini or micro LED light board as a backlight source has high contrast, long life, low power consumption, and other characteristics. In the process of manufacturing the display apparatus using mini or micro LEDs as the light-emitting devices, after the light board has been fabricated, a plurality of light boards need to be packaged for the subsequent manufacturing process. The relative packaging technology has become one of the current research hotspots.

SUMMARY

In an aspect, a light board is provided. The light board includes a substrate, a plurality of light-emitting elements disposed on the substrate, and at least one support pin disposed on the substrate. The plurality of light-emitting elements are arranged in an array on the substrate. The substrate is provided with a plurality of substrate avoidance holes. In the first direction, at least one substrate avoidance hole is disposed at each of two sides of a support pin.

In some embodiments, centers of two substrate avoidance holes respectively at the two sides of the support pin have equal distances to the support pin.

In some embodiments, the support pin includes a pillar and a base plate that are connected. The base plate is closer to the substrate than the pillar, and the base plate is connected to the substrate.

In some embodiments, a height of the support pin is in a range of 12 mm to 21 mm, inclusive; and a size of the base plate is in a range of 5 mm to 7 mm, inclusive.

In another aspect, a whole structure is provided. The whole structure includes a plurality of light boards each as described in the above aspect, and a carrying device including a plurality of carrying plates. Each carrying plate in the plurality of carrying plates is used to carry a light board. The plurality of carrying plates and the plurality of light boards are alternately arranged in a second direction. Every adjacent carrying plate and light board serve as a group of packaging structure, and in the group of packaging structure, the light board is disposed on the carrying plate. Each carrying plate is provided with a plurality of plate avoidance holes therein. Positions of the plurality of carrying plates are relatively fixed, and every two adjacent light boards are relatively misaligned. In the group of packaging structure, at least one plate avoidance hole corresponds to at least one substrate avoidance hole, and the at least one plate avoidance hole and the at least one substrate avoidance hole serve as an avoidance hole group. In the second direction, a support pin of a light board in a group of packaging structure located below passes through an avoidance hole group in at least one group of packaging structure located above. The second direction is perpendicular to a plane where the light board is located, and the second direction is a direction in which the support pin of the light board is away from the substrate.

In some embodiments, each carrying plate includes at least one first avoidance area, and at least two plate avoidance holes arranged in the first direction are disposed in a first avoidance area. Each light board includes at least one second avoidance area, and at least two substrate avoidance holes and one support pin arranged in the first direction are disposed in a second avoidance area. In the first direction, at least one substrate avoidance hole is disposed at each of two sides of the support pin. The first avoidance area corresponds to the second avoidance area in the second direction.

In some embodiments, N plate avoidance holes are disposed in the first avoidance area of each carrying plate; and M substrate avoidance holes are disposed in the second avoidance area of each light board. In the second direction, the support pin of the light board in the group of packaging structure located below passes through avoidance hole groups in at least L groups of packaging structures located above, where N is equal to a sum of L and 1 (N=L+1), and M is equal to twice L (M=2L).

In some embodiments, two plate avoidance holes are disposed in the first avoidance area of the carrying plate; two substrate avoidance holes are disposed in the second avoidance area of the light board, and the two substrate avoidance holes are respectively disposed at the two sides of the support pin located in the second avoidance area. In the second direction, the support pin of the light board in the group of packaging structure located below passes through an avoidance hole group in one group of packaging structure located above. In the second direction, the plurality of light boards are arranged in a periodic manner in a group of every two light boards.

In some embodiments, third plate avoidance holes are disposed in the first avoidance area of the carrying plate; four substrate avoidance holes are disposed in the second avoidance area of the light board, and two substrate avoidance holes are disposed at each of the two sides of the support pin located in the second avoidance area. In the second direction, the support pin of the light board in the group of packaging structure located below passes through avoidance hole groups in two groups of packaging structures located above. In the second direction, the plurality of light boards are arranged in a periodic manner in a group of every three light boards.

In some embodiments, each carrying plate includes a plurality of first avoidance areas disposed in a third direction, and at least two plate avoidance holes arranged in the first direction are disposed in each first avoidance area. Each light board includes a plurality of second avoidance areas disposed in the third direction, and at least two substrate avoidance holes and one support pin arranged in the first direction are disposed in each second avoidance area. In the group of packaging structure, each first avoidance area corresponds to a second avoidance area in the second direction. The third direction intersects the first direction.

In some embodiments, in the first direction, a distance between centers of two adjacent plate avoidance holes is equal to a distance between a center of the support pin and a center of a substrate avoidance hole adjacent to the support pin.

In some embodiments, the distance between the centers of the two adjacent plate avoidance holes is equal to a distance between centers of two adjacent substrate avoidance holes, and the two adjacent substrate avoidance holes are provided with no support pin therebetween.

In some embodiments, a maximum dimension of a cross-section of the support pin is smaller than a dimension of a plate avoidance hole and smaller than a dimension of the substrate avoidance hole.

In some embodiments, the dimension of the plate avoidance hole is equal to the dimension of the substrate avoidance hole.

In some embodiments, the plate avoidance hole or the substrate avoidance hole is in a shape of a circle, a square or a polygon.

In some embodiments, at least two adjacent plate avoidance holes in the carrying plate are connected to be an elongated hole.

In yet another aspect, a placing method of light board package is provided. The placing method includes: placing a first layer of carrying plate as a bottom carrying plate, and alternately placing light boards and carrying plates on the bottom carrying plate until a last layer of light board is placed on a last layer of carrying plate. A plurality of carrying plates and a plurality of light boards are arranged alternately in a second direction, every adjacent carrying plate and light board serve as a group of packaging structure, and in the group of packaging structure, the light board is disposed on the carrying plate. The light board includes a substrate and at least one support pin disposed on the substrate. Each carrying plate is provided with a plurality of plate avoidance holes therein, and each substrate is provided with a plurality of substrate avoidance holes therein. Positions of the plurality of carrying plates are relatively fixed, and every two adjacent light boards are relatively misaligned. In the group of packaging structure, at least one plate avoidance hole corresponds to at least one substrate avoidance hole, and the at least one plate avoidance hole and the at least one substrate avoidance hole serve as an avoidance hole group. In the second direction, a support pin of a light board in a group of packaging structure located below passes through an avoidance hole group in at least one group of packaging structure located above.

BRIEF DESCRIPTION OF THE DRAWINGS

In order to describe technical solutions in the present disclosure more clearly, accompanying drawings to be used in some embodiments of the present disclosure will be introduced briefly below. Obviously, the accompanying drawings to be described below are merely accompanying drawings of some embodiments of the present disclosure, and a person of ordinary skill in the art may obtain other drawings according to these drawings. In addition, the accompanying drawings to be described below may be regarded as schematic diagrams, but are not limitations on an actual size of a product and an actual process of a method to which the embodiments of the present disclosure relate.

DETAILED DESCRIPTION

Figure 1:
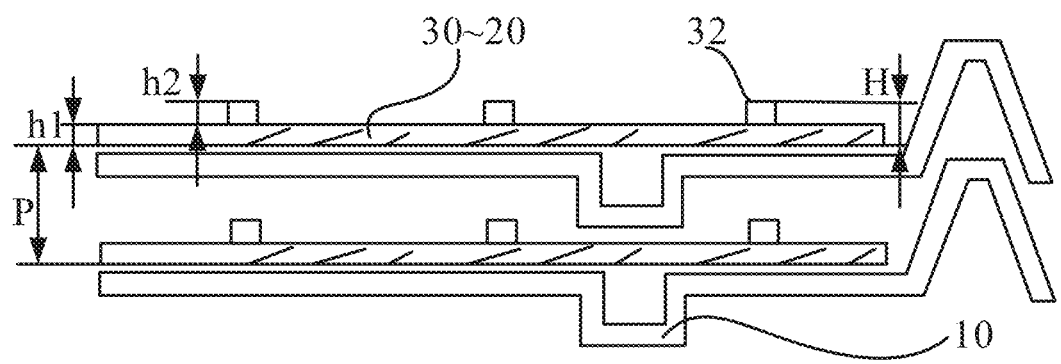
FIG. 1 is a diagram showing a placement structure of a light board without support pins, in accordance with some embodiments in the prior art.

Technical solutions in some embodiments of the present disclosure will be described clearly and completely with reference to the accompanying drawings below. Obviously, the described embodiments are merely some but not all embodiments of the present disclosure. All other embodiments obtained by a person of ordinary skill in the art based on the embodiments of the present disclosure shall be included in the protection scope of the present disclosure.

Unless the context requires otherwise, throughout the description and the claims, the term "comprise" and other forms thereof such as the third-person singular form "comprises" and the present participle form "comprising" are construed as open and inclusive, i.e., "including, but not limited to". In the description of the specification, the terms such as "one embodiment", "some embodiments", "exemplary embodiments", "example", "specific example" or "some examples" are intended to indicate that specific features, structures, materials or characteristics related to the embodiment(s) or example(s) are included in at least one embodiment or example of the present disclosure. Schematic representations of the above terms do not necessarily refer to the same embodiment(s) or example(s). In addition, the specific features, structures, materials, or characteristics described herein may be included in any one or more embodiments or examples in any suitable manner.

Hereinafter, the terms such as "first" and "second" are used for descriptive purposes only, and are not to be construed as indicating or implying the relative importance or implicitly indicating the number of indicated technical features. Thus, features defined with "first" or "second" may explicitly or implicitly include one or more of the features. In the description of the embodiments of the present disclosure, term "a plurality of" or "the plurality of" means two or more unless otherwise specified.

The phrase "at least one of A, B and C" has a same meaning as the phrase "at least one of A, B or C", and they both include the following combinations of A, B and C: only A, only B, only C, a combination of A and B, a combination of A and C, a combination of B and C, and a combination of A, B and C.

The phrase "A and/or B" includes the following three combinations: only A, only B, and a combination of A and B.

The phrase "applicable to" or "configured to" as used herein indicates an open and inclusive expression, which does not exclude apparatuses that are applicable to or configured to perform additional tasks or steps.

In addition, the use of the phrase "based on" is meant to be open and inclusive, since a process, step, calculation or other action that is "based on" one or more of the stated conditions or values may, in practice, be based on additional conditions or values exceeding those stated.

The term "about", "substantially" or "approximately" as used herein includes a stated value and an average value within an acceptable range of deviation of a particular value. The acceptable range of deviation is determined by a person of ordinary skill in the art in consideration of the measurement in question and errors associated with the measurement of a particular quantity (i.e., limitations of the measurement system).

The term such as "parallel", "perpendicular" or "equal" as used herein includes a stated condition and a condition similar to the stated condition. A range of the similar condition is within an acceptable range of deviation. The acceptable range of deviation is determined by a person of ordinary skill in the art in view of measurement in question and errors associated with the measurement of a particular quantity (i.e., limitations of the measurement system). For example, the term "parallel" includes absolute parallelism and approximate parallelism, and an acceptable range of deviation of the approximate parallelism may be a deviation within 5°; the term "perpendicular" includes absolute perpendicularity and approximate perpendicularity, and an acceptable range of deviation of the approximate perpendicularity may also be a deviation within 5°; and the term "equal" includes absolute equality and approximate equality, and an acceptable range of deviation of the approximate equality may be a difference between two equals being less than or equal to 5% of either of the two equals.

It will be understood that when a layer or element is referred to as being on another layer or substrate, the layer or element may be directly on the another layer or substrate, or there may be intermediate layer(s) between the layer or element and the another layer or substrate.

Exemplary embodiments are described herein with reference to sectional views and/or plan views as idealized exemplary drawings. In the accompanying drawings, thicknesses of layers and sizes of regions are enlarged for clarity. Variations in shapes relative to the accompanying drawings due to, for example, manufacturing technologies and/or tolerances may be envisaged. Therefore, the exemplary embodiments should not be construed to be limited to the shapes of regions shown herein, but to include deviations in the shapes due to, for example, manufacturing. For example, an etched region shown in a rectangular shape generally has a feature of being curved. Therefore, the regions shown in the accompanying drawings are schematic in nature, and their shapes are not intended to show actual shapes of the regions in an apparatus, and are not intended to limit the scope of the exemplary embodiments.

At present, with the development of display technologies, mini LED display apparatuses are facing the trend of cost reduction. In some large-sized display apparatuses, the support pin 40, as a support device, is mainly used to support some optical film structures. As a result, the usage amount of the support pins is very large. For example, a 100-inch display apparatus requires 96 support pins. However, the support pins 40 are all operated in manual. In addition to low labor efficiency, high costs will further be generated.

Figure 2:
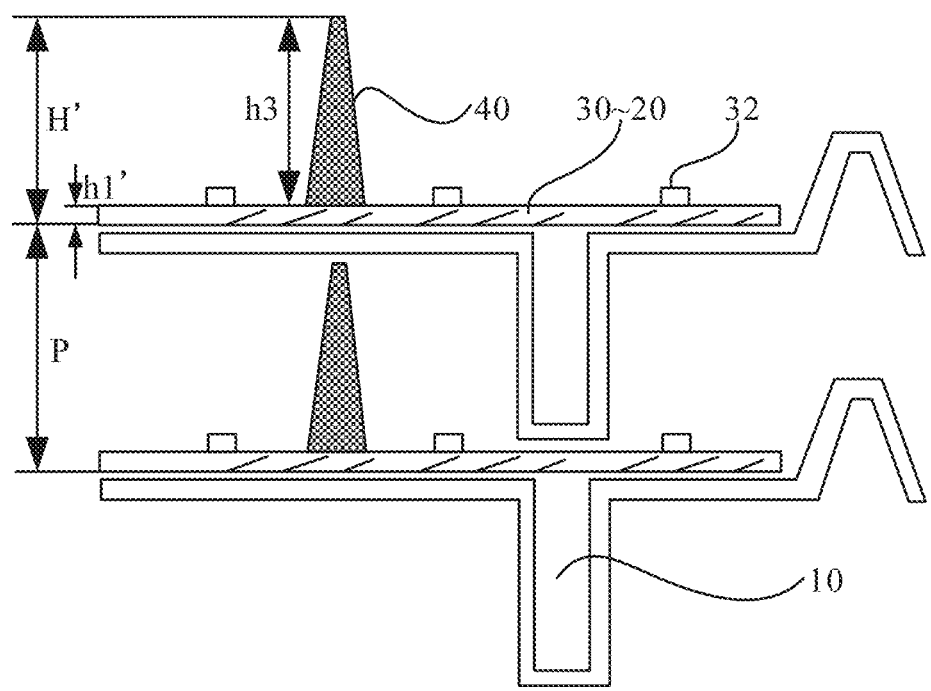
FIG. 2 is a diagram showing a placement structure of a light board with support pins, in accordance with some embodiments in the prior art.

As shown in FIGS. 1 and 2, a light board 20 includes a substrate 30 and a plurality of light-emitting elements 32 disposed on the substrate. The light-emitting elements 32 are, for example, mini LEDs or micro LEDs. As shown in FIG. 2, the light board 20 further includes at least one support pin 40 disposed on the substrate 30.

In the process of manufacturing the mini LED display apparatus, after the light board 20 is fabricated, a plurality of light boards 20 need to be packaged for the subsequent manufacturing process. As shown in FIGS. 1 and 2, the plurality of light boards 20 are stacked. In order to protect components in the light boards 20, each light board 20 needs a corresponding support structure for supporting and carrying, so that two adjacent light boards 20 are separated from each other and do not affect each other. The supporting structure is, for example, a carrying plate, so that the plurality of light boards 20 and a plurality of carrying plates are alternately arranged, and finally a whole structure is put into a packaging box.

Referring to FIG. 2, where FIG. 2 is a diagram showing a placement structure of the light board 20 soldered with the support pin 40, the light board 20 is laid on the carrying plate 10, and the carrying plate 10 is configured to carry the light board 20. Compared FIG. 1 to FIG. 2, a height of the light board 20 significantly increases due to the arrangement of the support pin 40 in FIG. 2. The height H of the light board 20 in FIG. 1 is equal to a sum of a height h1 of the substrate 30 and a height h2 of the light-emitting element 32, while the height H' of the light board 20 in FIG. 2 is equal to a sum of a height h1' of the substrate 30 and a height h3 of the support pin 40. For example, in FIG. 1, the height H of the light board 20 is 2 mm, and the height h1 of the substrate 30 is 1 mm; and in FIG. 2, the height h3 of the support pin 40 is 12 mm, and it may be obtained that the height H' of the light board 20 in FIG. 2 is equal to 13 mm. Here, only the corresponding height of a single layer of light board 20 is illustrated. During actual packaging, the light boards 20 are stacked. FIGS. 1 and 2 only show the stacking of two layers of light boards 20. Therefore, compared to FIG. 1, the height of each layer of light board 20 in FIG. 2 increases, so that a distance P between two adjacent light boards (or the distance between two adjacent carrying plates) increases, and thus the final increased packaging height is a product of the increased height in each layer of light board 20 and the number of layers. As the number of stacked layers of the light boards increases, the packaging height also increases. Obviously, for the same packaging box, the packaging amount that can be accommodated, that is, the number of the light boards decreases, thereby reducing production efficiency. In addition, as the specification height of the support pin 40 gradually becomes larger, the cost of packaging and transportation will greatly increase, and the soldered support pin 40 cannot be used in large-sized display apparatuses due to size requirements.

In light of this, some embodiments of the present disclosure provide a light board and a carrying device 200 thereof, and a placing method of light board package. By jointly designing the structures of the light board 20 and the carrying device 200, the packaging amount of the light boards may be doubled. Thus, the production costs may be greatly saved, and the production efficiency may be improved, so that the support pins may be widely promoted and applied to all mini LED products.

The light board and the carrying device 200 thereof, and the placing method of light board package provided by the present disclosure will each be introduced below.

Figure 3A:
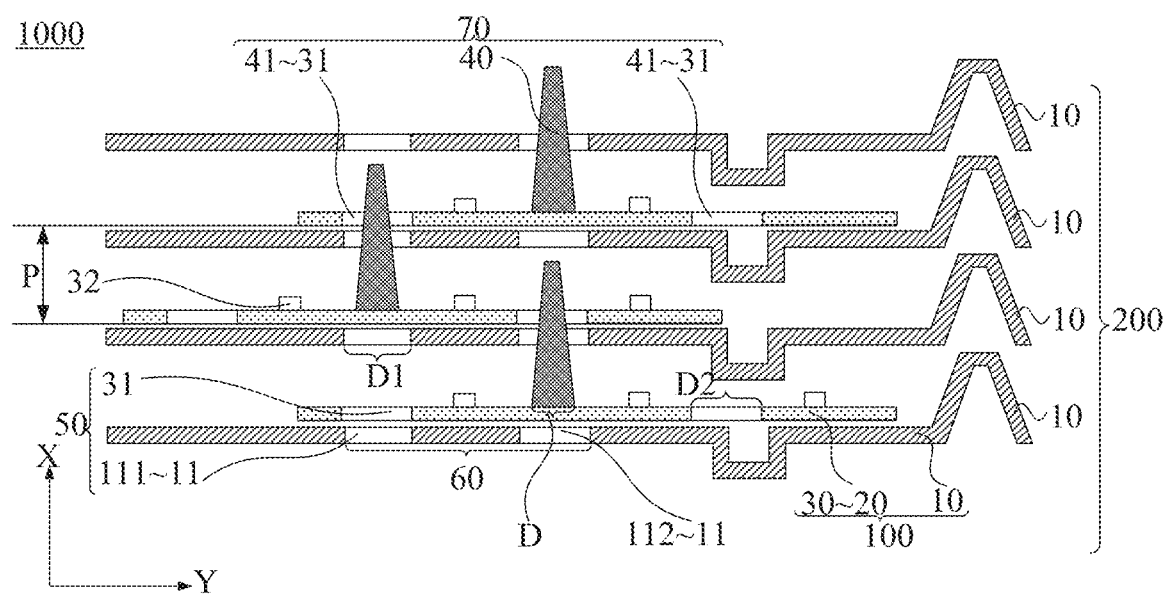
FIG. 3A is a diagram showing a side stacking structure of a light board and a carrying device, in accordance with some embodiments of the present disclosure.
Figure 4A:
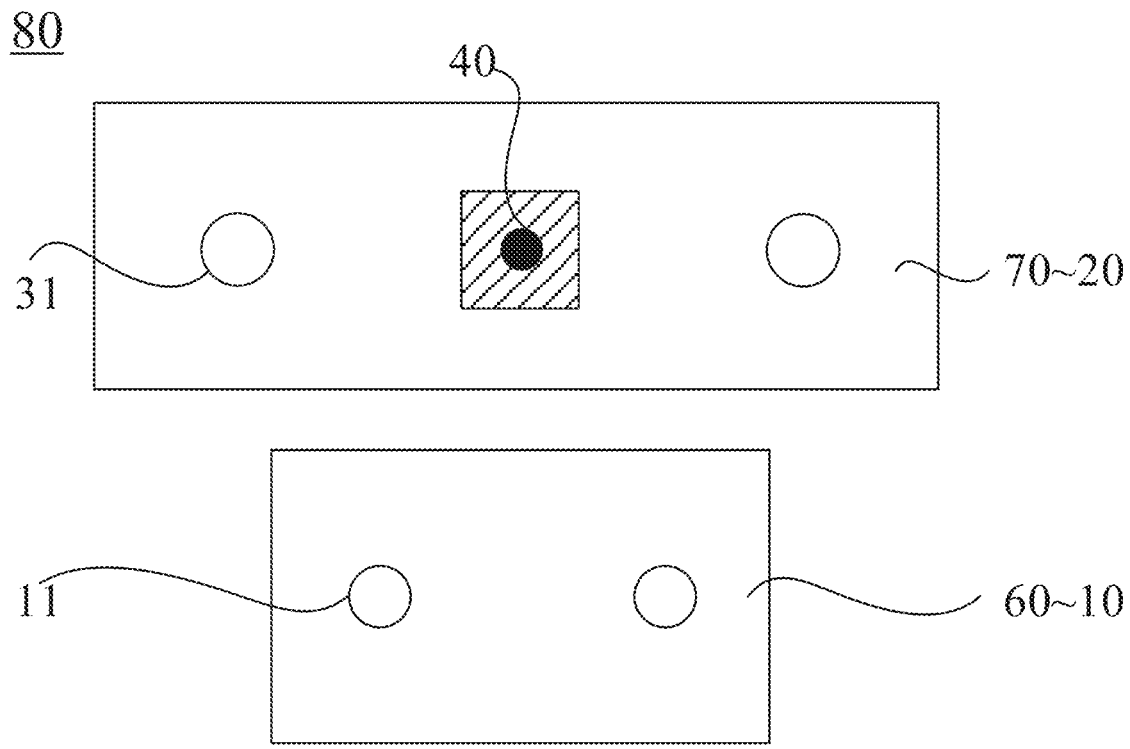
FIG. 4A is a diagram showing a structure of a packaging matching unit, in accordance with some embodiments of the present disclosure.
Figure 4B:
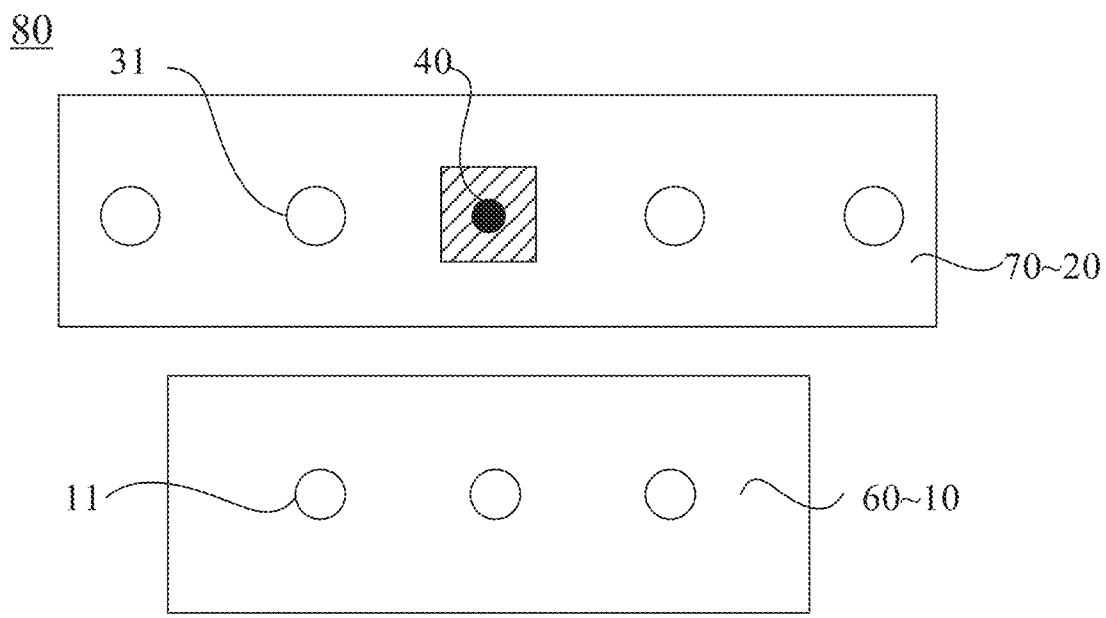
FIG. 4B is a diagram showing a structure of another packaging matching unit, in accordance with some embodiments of the present disclosure.
Figure 5A:
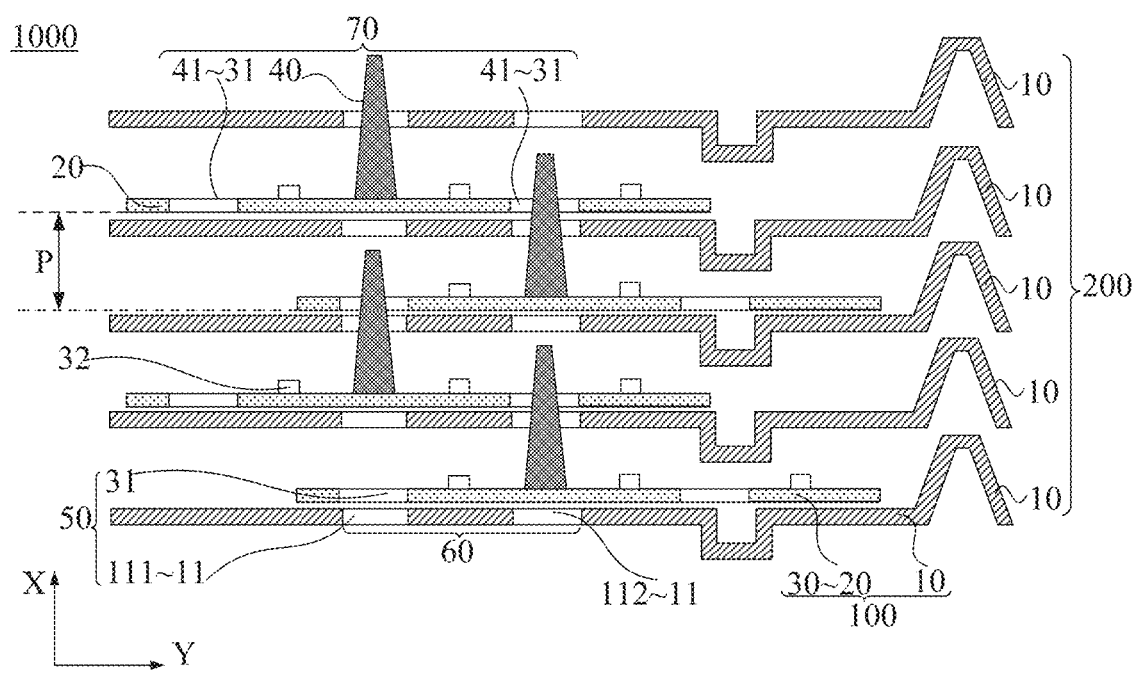
FIG. 5A is another diagram showing a side stacking structure of a light board and a carrying device, in accordance with some embodiments of the present disclosure.
Figure 5B:
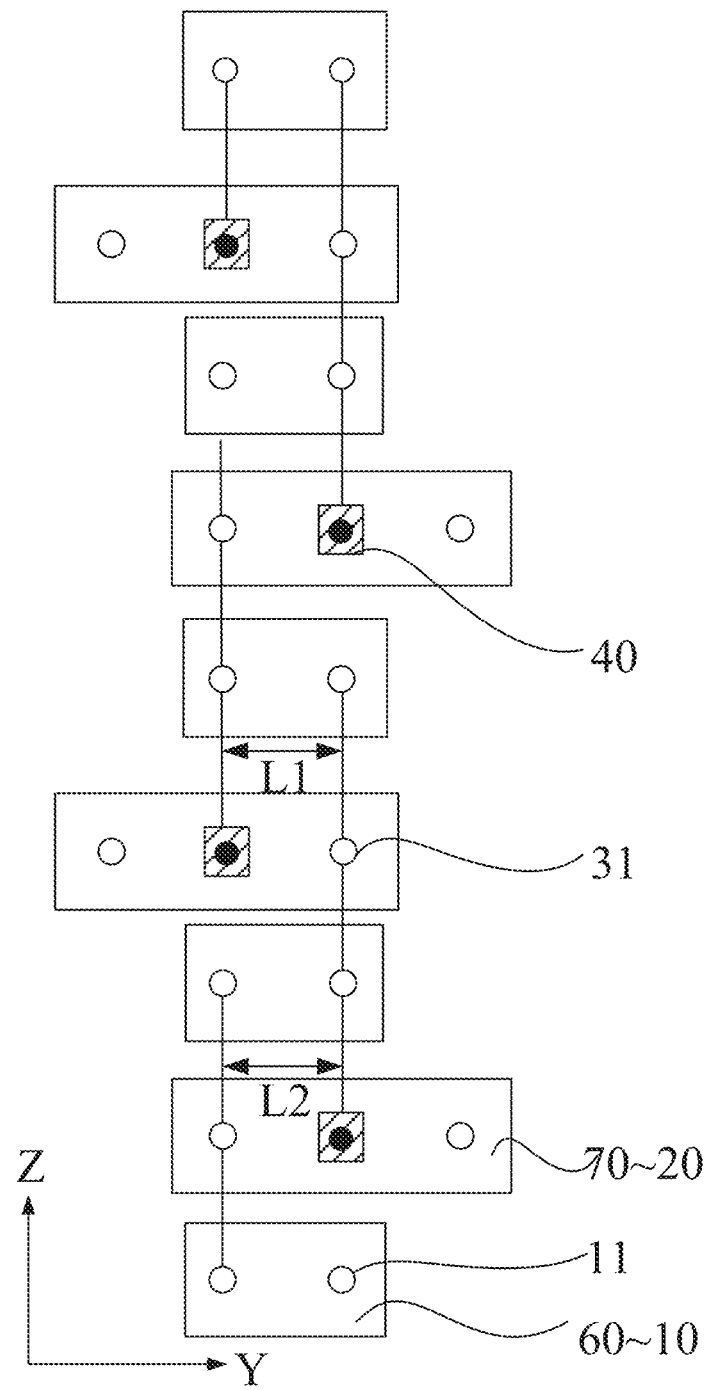
FIG. 5B is a diagram showing a plane stacking of a light board and a carrying device, in accordance with some embodiments of the present disclosure.
Figure 6A:
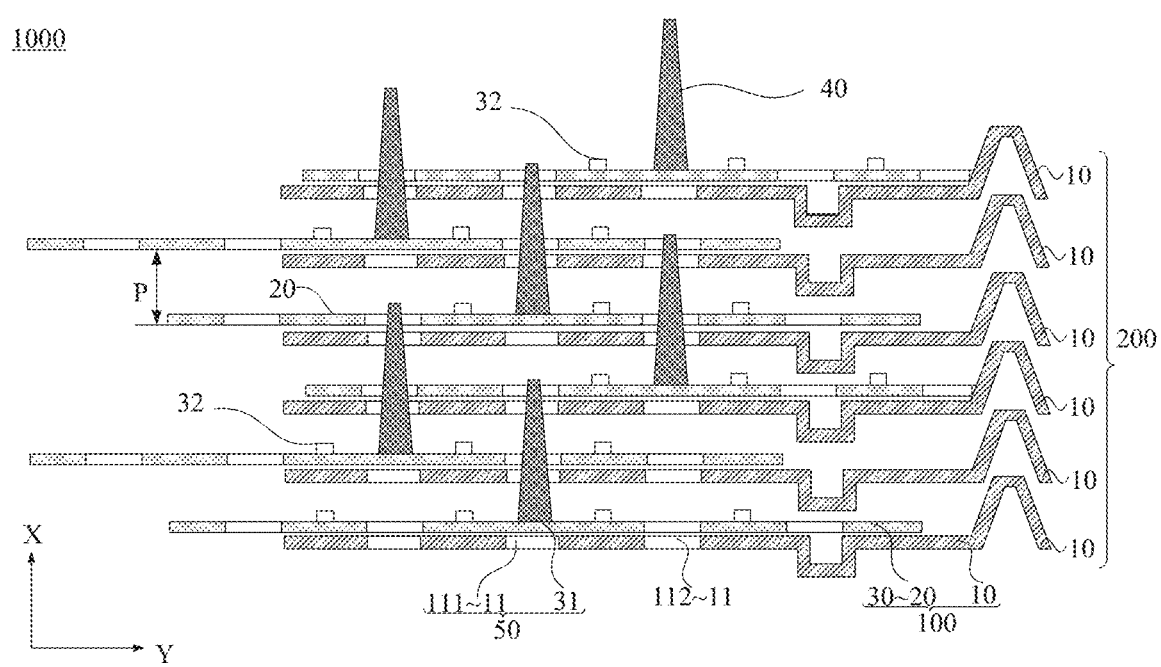
FIG. 6A is yet another diagram showing a side stacking structure of a light board and a carrying device, in accordance with some embodiments of the present disclosure.
Figure 6B:
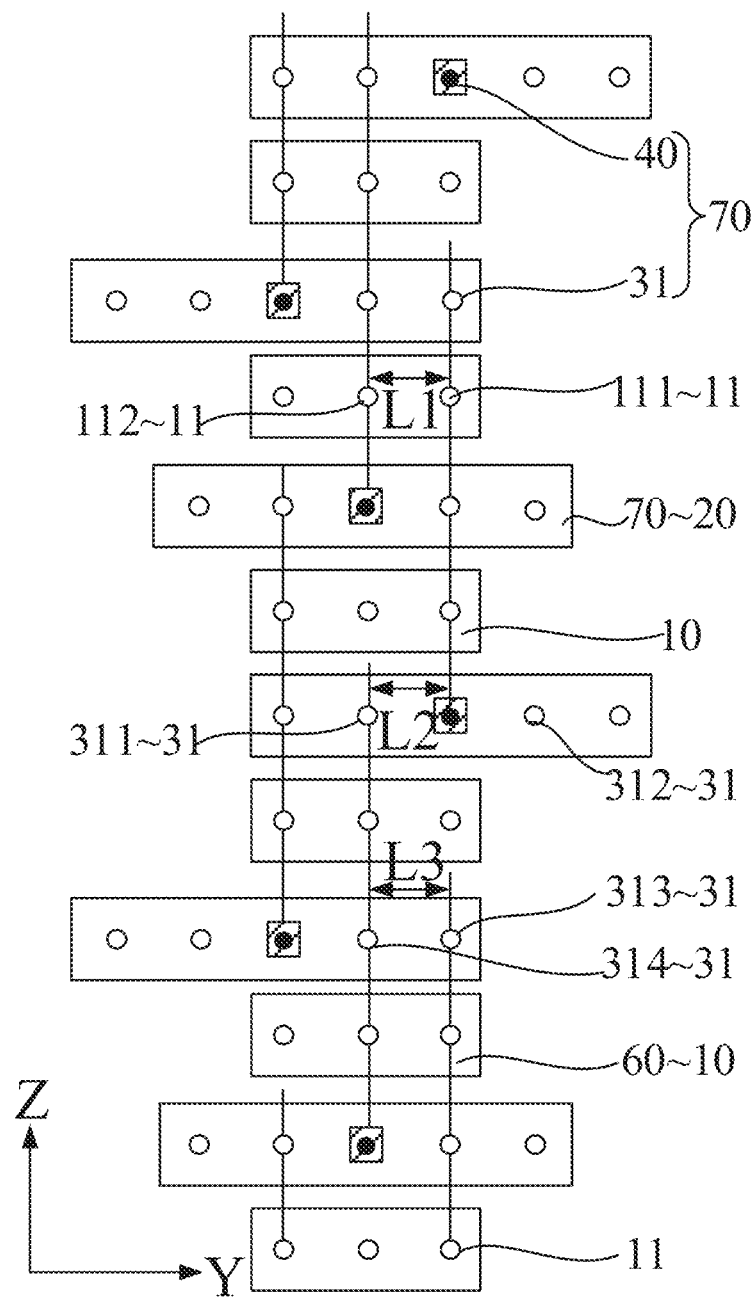
FIG. 6B is another diagram showing a plane stacking of a light board and a carrying device, in accordance with some embodiments of the present disclosure.

In the present disclosure, FIGS. 3A, 5A and 6A are each a diagram showing a side stacking structure of the light board and the carrying device 200, and FIGS. 5B and 6B are each a diagram showing a plane stacking of the light board and the carrying device 200. FIGS. 4A and 4B are each only a diagram showing a stacked structure of a single layer of light board and carrying device 200, so as to facilitate the description of the whole stacked structure.

Figure 7:
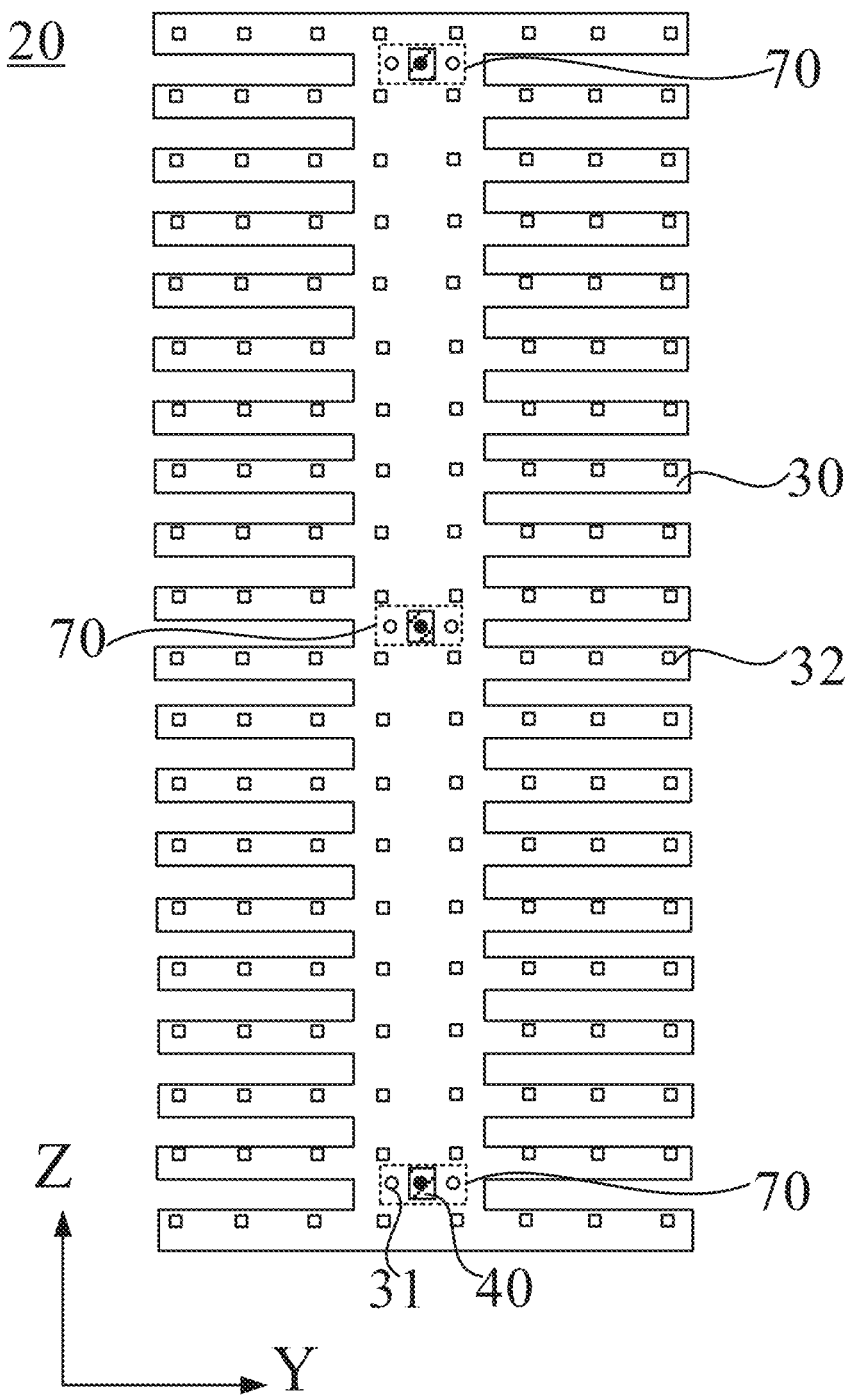
FIG. 7 is a diagram showing a plane structure of a light board, in accordance with some embodiments of the present disclosure.
Figure 9:
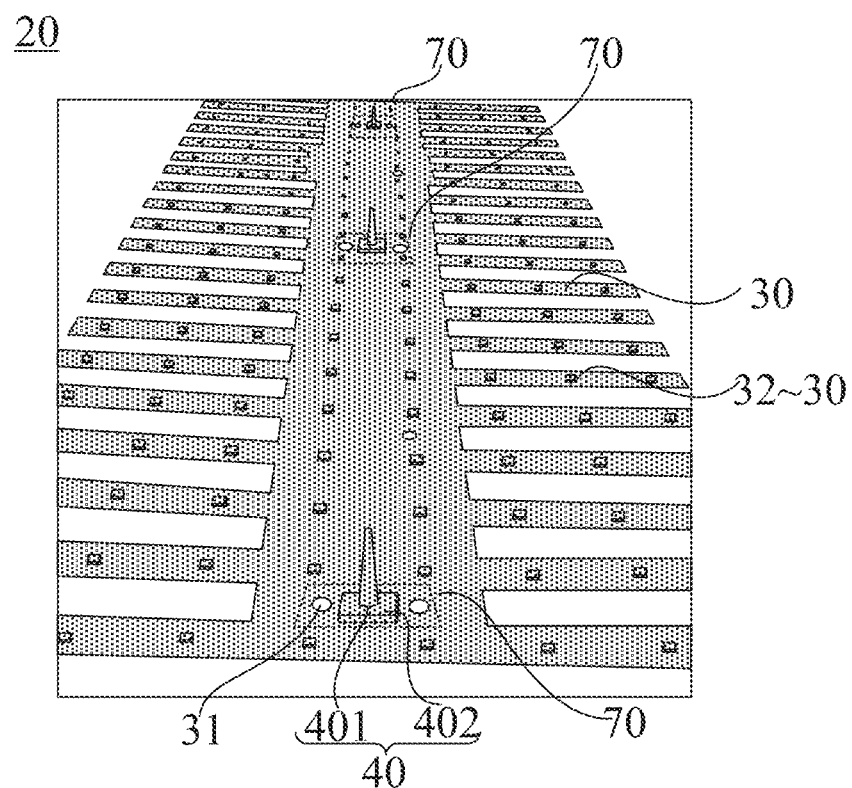
FIG. 9 is a diagram showing a structure of a light board, in accordance with some embodiments of the present disclosure.

Some embodiments of the present disclosure provide a light board 20. As shown in FIGS. 3A, 7 and 9, the light board 20 includes a substrate 30, a plurality of light-emitting elements 32 disposed on the substrate, and at least one support pin 40 disposed on the substrate. The plurality of light-emitting elements 32 are arranged in an array on the substrate 30, and the substrate 30 is provided with a plurality of substrate avoidance holes 31 therein. In a first direction Y, at least one substrate avoidance hole 31 is disposed at each of two sides of a support pin 40 is.

It will be noted that, the first direction Y here refers to a horizontal direction perpendicular to the support pin 40.

In some embodiments, centers of two substrate avoidance holes 31 respectively at the two sides of the support pin 40 have equal distances to the support pin 40.

For example, the substrate avoidance holes 31 located at both sides of the support pin 40 are arranged symmetrically with respect to the support pin 40, and the centers of the substrate avoidance holes 31 and the center of the support pin 40 are located on the same straight line.

In some embodiments, the support pin 40 includes a pillar 401 and a base plate 402 that are connected. The base plate 402 is closer to the substrate 30 than the pillar 401, and the base plate 402 is connected to the substrate 30.

Figure 10:
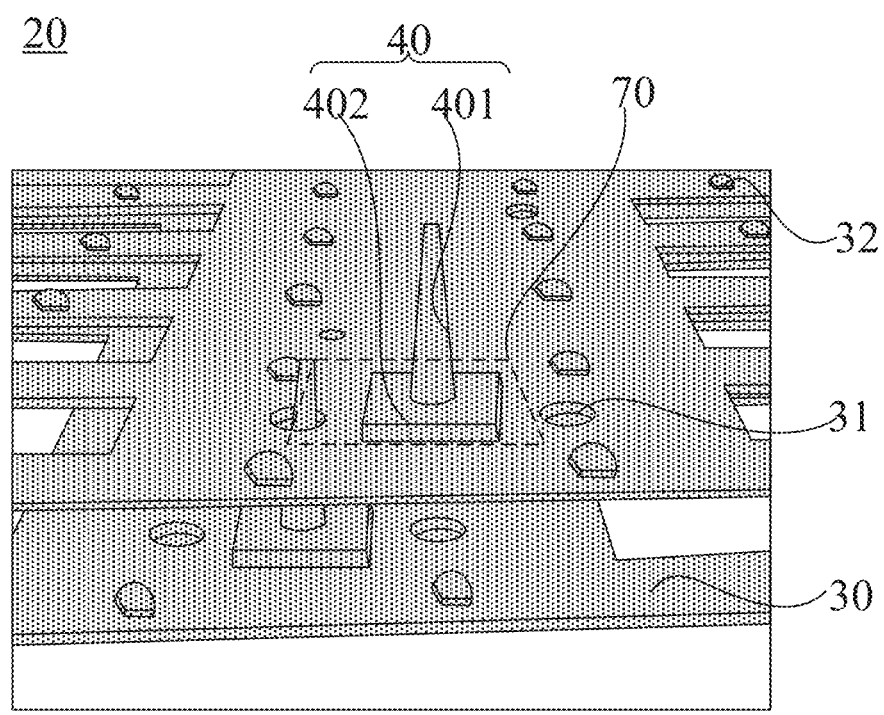
FIG. 10 is a diagram showing a three-dimensional structure of a light board, in accordance with some embodiments of the present disclosure.

As shown in FIG. 10, the base plate 402 of the support pin 40 is connected to the substrate 30, and the pillar 401 connected thereto is arranged on the base plate 402. The pillar 401 passes through the substrate avoidance hole 31 in the substrate 30 above the pillar 401.

In some embodiments, a height of the support pin 40 is in a range of 12 mm to 21 mm, inclusive, and a size of the base plate is in a range of 5 mm to 7 mm, inclusive.

In some embodiments, as shown in FIGS. 7, 9 and 10, the substrate 30 of the light board 20 further includes a conductive metal layer, and the base plate 402 of the support pin 40 is connected to the conductive metal layer.

For example, the light-emitting element 32 may be a light-emitting diode (LED). The size of the light-emitting diode is greater than or equal to 500 μm, and the distance between the light-emitting diodes is greater than 2 mm. That is to say, the light-emitting diode is used as a point light source of the light board 20. The metal conductive layer is made of a metal material with good conductivity, such as copper. The base plate 402 of the support pin 40 is connected to the copper layer of the metal conductive layer.

In some embodiments, the light board 20 is applied to a backlight module and used as a backlight source. The backlight module is used in a liquid crystal display apparatus, and the backlight module and a liquid crystal display panel are arranged in stack. The backlight module is located on a non-display side of the display panel and provides light for the display panel, so that the display apparatus may achieve display.

Some embodiments of the present disclosure further provide a carrying device 200. As shown in FIG. 3A, the carrying device 200 includes a plurality of carrying plates 10. For example, the carrying plate 10 is a blister tray. Each carrying plate 10 in the plurality of carrying plates 10 is used to carry a light board 20 as described above. Each carrying plate 10 is provided with a plurality of plate avoidance holes 11 therein, and each substrate 30 is provided with a plurality of substrate avoidance holes 31 therein. The plurality of carrying plates 10 and the plurality of light boards 20 are alternately arranged in a second direction X. The positions of the plurality of carrying plates 10 are relatively fixed, and every two adjacent light boards 20 are relatively misaligned. The carrying plate 10 and the light board 20 that are adjacent serve as a group of packaging structure 100. In a group of packaging structure 100, the light board 20 is arranged on the carrying plate 10. At least one of the plurality of plate avoidance holes 11 and at least one of the plurality of substrate avoidance holes 31 are corresponding and serve as an avoidance hole group 50.

In the second direction X, a support pin 40 of a light board 20 in a group of packaging structure 100 located below passes through an avoidance hole group 50 in at least one group of packaging structure 100 located above. The second direction X is perpendicular to a plane where the light board 20 is located, the second direction X is a direction in which the support pin 40 of the light board 20 is away from the substrate 30, and the second direction X is perpendicular to the first direction Y.

It will be noted that for the description that the plurality of carrying plates 10 and the plurality of light boards 20 are alternately arranged in the second direction X, the "alternately arranged" here means that the carrying plates 10 and the light boards 20 are alternately laid in sequence in the second direction X. For the description that the positions of the plurality of carrying plates 10 are relatively fixed, and every two adjacent light boards 20 are relatively misaligned, the reference of "relatively fixed" here is a carrying plate 10, and the position between any carrying plate 10 and the carrying plate 10 in the second direction X is fixed; and the reference of the "relatively misaligned" is a light board 20, and an adjacent light board 20 and the light board 20 are misaligned in the second direction X.

The substrate 30 of the light board 20 and the carrying plate 10 are each provided with avoidance holes therein. Referring to FIGS. 4A and 4B, the substrate avoidance hole 31 is a through hole provided in the substrate 10, and the plate avoidance hole 11 is a through hole provided in the carrying plate 10. In a group of packaging structure 100, the light board 20 is disposed on the carrying plate 10, and the carrying plate 10 is configured to carry the light board 20. At least one plate avoidance hole 11 in the plurality of plate avoidance holes 11 and at least one substrate avoidance hole 31 in the plurality of substrate avoidance holes 31 are corresponding in position and serve as the avoidance hole group 50. The plate avoidance hole 11 and the substrate avoidance hole 31 being corresponding in position means that in a group of packaging structure 100, an area enclosed by a boundary line of an orthogonal projection of the substrate avoidance hole 31 on the carrying plate at least partially overlaps an area enclosed by a boundary line of the plate avoidance hole 11. For example, the areas enclosed by the boundary lines of the holes 11 are at least partially overlapped, for example, the areas enclosed by the boundary lines of the two are completely overlapped.

In the second direction X, the support pin 40 of the light board 20 in the group of packaging structure 100 located below passes through the avoidance hole group 50 in the at least one group of packaging structure 100 located above. Such a provision may save space. Moreover, since every two adjacent light boards 20 are relatively misaligned, the support pin 40 of each layer of light board 20 may be ensured to pass through an avoidance hole group 50 of at least one group of packaging structure 100 located above. Compared with FIG. 2, during gradual stacking, the utilization rate of the limited height may increase, and the distance P between two adjacent layers of light boards 20 may be reduced, for example, by half or more. Therefore, the size of the whole structure 1000 composed of the plurality of light boards 20 and the plurality of carrying plates 10 in the first direction Y may be reduced, that is, the size of the whole structure 1000 in the longitudinal direction is compressed. As a result, in a certain height range, for example, in a case where the packaging box has a fixed size, due to more layers of light boards 20 that can be stacked, the space utilization rate may increase, and the packaging amount of the light boards 20 may increase, thereby greatly saving the cost. In addition, there is no need to reduce the amount of the support pins 40 due to packaging issues, so that more support pins 40 may be applied in mini LED display apparatus.

Figure 3B:
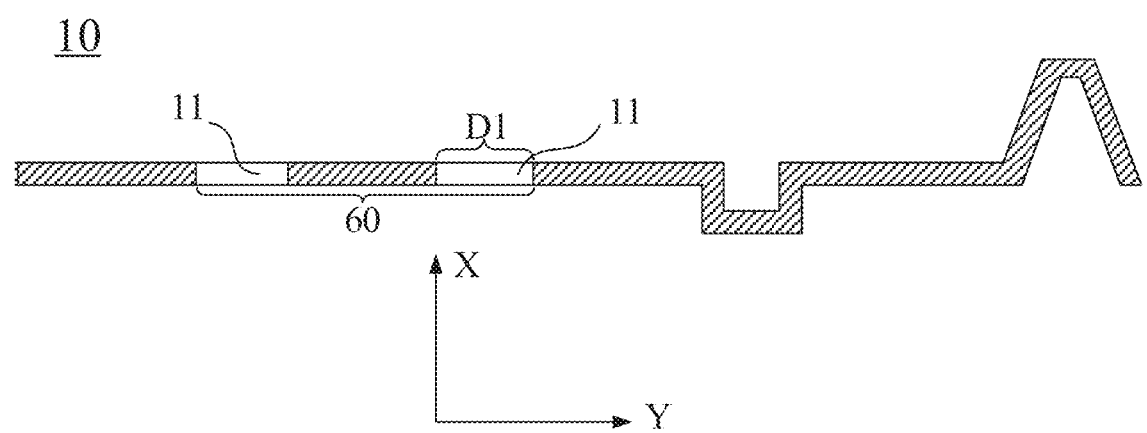
FIG. 3B is a diagram showing a side structure of a carrying plate, in accordance with some embodiments of the present disclosure.
Figure 3C:
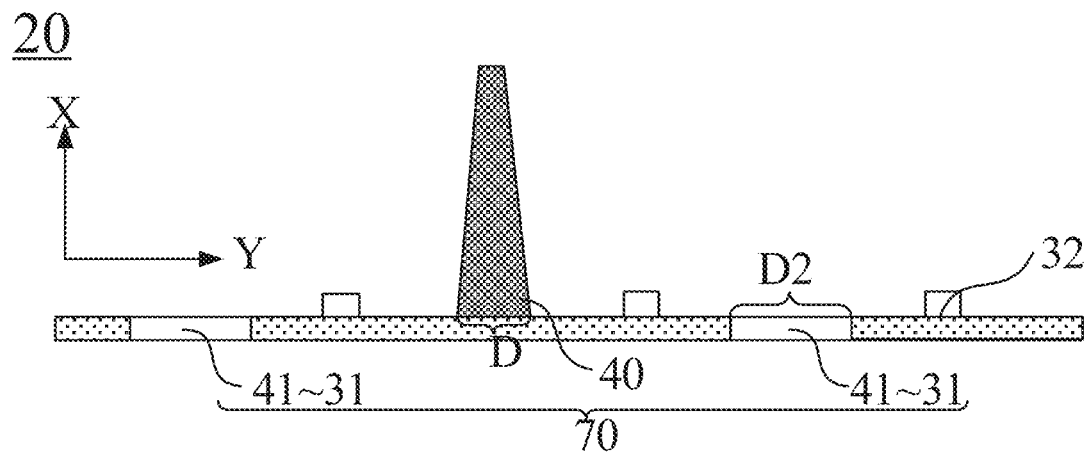
FIG. 3C is a diagram showing a side structure of a light board, in accordance with some embodiments of the present disclosure.

In some embodiments, referring to FIG. 3B, each carrying plate 10 includes at least one first avoidance area 60, and the first avoidance area 60 is provided therein with at least two plate avoidance holes 11 arranged in the first direction Y. Referring to FIG. 3C, each light board 20 includes at least one second avoidance area 70, and the second avoidance area 70 is provided therein with at least two substrate avoidance holes 31 and one support pin 40 arranged in the first direction Y. In the first direction Y, at least one substrate avoidance hole 31 (e.g., the second avoidance hole 41) is disposed at each of two sides of the support pin 40. The first avoidance area 60 corresponds to the second avoidance area 70 in the second direction X. In the first direction Y, every two adjacent light boards 20 are relatively misaligned.

As shown in FIG. 3A, the second direction X is a direction in which the support pin 40 of the light board 20 is away from the substrate 30, and the first direction Y and the second direction X are perpendicular to each other. The carrying plate 10 shown in FIG. 3B and the light board 20 shown in FIG. 3C may constitute a group of packaging structure 100. As shown in FIG. 4A, which is a form of a packaging matching unit 80 included in a group of packaging structure 100, the packaging matching unit 80 includes two plate avoidance holes 11 in the carrying plate 10 and a carrying plate unit, and two substrate avoidance holes 31 in the light board 20 and a support pin 40 located between the two substrate avoidance holes 31. As shown in FIG. 4B, which is another form of a packaging matching unit 80 included a group of packaging structure 100, the packaging matching unit 80 includes three plate avoidance holes 11 in the carrying plate 10 and a carrying plate unit, and four substrate avoidance holes 31 in the light board 20 and a support pin 40 located in the middle of the four substrate avoidance holes 31.

In some embodiments, the first avoidance area 60 of the carrying plate 10 is provided with N plate avoidance holes 11 therein, and the second avoidance area 70 of the light board 20 is provided with M substrate avoidance holes 31 therein. In the second direction X, a support pin 40 of a light board 20 in a group of packaging structure 100 located below passes through avoidance hole groups 50 in at least L groups of packaging structures 100 located above, where N is equal to a sum of L and 1 (N=L+1), and M is equal to twice L (M=2L).

In some embodiments, as shown in FIG. 3A, centers of a plate avoidance hole 11 and a substrate avoidance hole 31 in a avoidance hole group 50 and a center of the support pin 40 are located on a horizontal line.

It can be understood that the first avoidance area 60 of the carrying plate 10 and the second avoidance area 70 of the light board 20 constitute a package matching unit 80.

For example, as shown in FIGS. 5A and 5B, where FIG. 5B is a structure diagram of plane stacking of FIG. 5A, the first avoidance area 60 of the carrying plate 10 is provided with two plate avoidance holes 11 therein, and the second avoidance area 70 of the light board 20 is provided with two substrate avoidance holes 31 therein. The two substrate avoidance holes 31 are respectively arranged at the two sides of the support pin 40.

In the second direction X, a support pin 40 of a light board 20 in a group of packaging structure 100 located below passes through an avoidance hole group 50 in one group of packaging structure 100 located above. In addition, in the second direction X, the plurality of light boards 20 are arranged in a periodic manner in a group of every two light boards 20.

As shown in FIG. 5A, the support pin 40 of the light board 20 in the group of packaging structure 100 located below passes through the avoidance hole group 50 in the group of packaging structure 100 located above. Therefore, L is equal to 1, N is equal to 2, and M is equal to 2. Referring to FIG. 5A, the plurality of light boards 20 are arranged in the periodic manner in a group of every two light boards 20. In the second direction X, the positions of the light boards 20 in adjacent layers are relatively misaligned, and the positions of the light boards 20 in every other layers are relatively fixed.

For example, as shown in FIGS. 6A and 6B, where FIG. 6B is a structure diagram of plane stacking of FIG. 6A, the first avoidance area 60 of the carrying plate 10 is provided with three plate avoidance holes 11 therein, and the second avoidance area 70 of the light board 20 is provided with four substrate avoidance holes 31 therein. Two substrate avoidance holes 31 are arranged at each of the two sides of the support pin 40.

In the second direction X, a support pin 40 of a light board 20 in a group of packaging structure 100 located below passes through avoidance hole groups 50 in two groups of packaging structures 100 located above. In addition, in the second direction X, the plurality of light boards 20 are arranged in a periodic manner in a group of every three light boards 20.

As shown in FIG. 6A, the support pin 40 of the light board 20 in the group of packaging structure 100 located below passes through the avoidance hole groups 50 in the two groups of packaging structures 100 located above. Therefore, L is equal to 2, N is equal to 3, and M is equal to 4. Referring to FIG. 6A, in the second direction X, the positions of the light boards 20 in adjacent layers are relatively misaligned, and the positions of the light boards 20 in every other two layers are relatively fixed.

It will be noted that the "relatively misaligned" here may be leftward or rightward misalign in the first direction Y. No matter whether it is leftward or rightward misalign, the distances of misalign here are the same.

In some embodiments, as shown in FIGS. 5B and 6B, each carrying plate 10 includes a plurality of first avoidance areas 60 arranged in a third direction Z, and each first avoidance area 60 is provided therein with at least two plate avoidance holes 11 arranged in the direction Y. As shown in FIG. 7, each light board 20 includes a plurality of second avoidance areas 70 arranged in the third direction Z, and each second avoidance area 70 is provided therein with at least two substrate avoidance holes 31 and one support pin 40 arranged in the first direction Y.

Referring to FIGS. 5A, 5B, 6A and 6B, in a group of packaging structure 100, each first avoidance area 60 corresponds to a second avoidance area 70 in the second direction X.

As shown in FIG. 7, the third direction Z intersects the first direction Y. The third direction Z is parallel to a direction where a long axis of the light board 20 is located, and the first direction Y is parallel to a direction where a short axis of the light board 20 is located. Therefore, the third direction Z and the first direction Y are perpendicular to each other.

In some embodiments, as shown in FIGS. 5B and 6B, in the first direction Y, a distance L1 between centers of two adjacent plate avoidance holes 11 is equal to a distance L2 between a center of the support pin 40 and a center of a substrate avoidance hole 31 adjacent thereto.

For example, referring to FIG. 6B, two adjacent plate avoidance holes 11 are a first plate avoidance hole 111 and a second plate avoidance hole 112, and the first plate avoidance hole 111 and the second plate avoidance hole 112 have the distance L1 therebetween. The adjacent substrate avoidance holes 31 are a first substrate avoidance hole 311 and a second substrate avoidance hole 312, and the center of the support pin 40 and the first substrate avoidance hole 311 have the distance L2 therebetween, or the center of the support pin 40 and the second substrate avoidance hole 312 have the distance L2 therebetween. The distance L1 is equal to the distance L2 (i.e., L1=L2).

In some embodiments, the distance between the centers of the two adjacent plate avoidance holes 11 is equal to a distance between centers of two adjacent substrate avoidance holes 31, and the two adjacent substrate avoidance holes 31 are provided with no support pin 40 therebetween.

For example, referring to FIG. 6B, the two adjacent plate avoidance holes 11 are the first plate avoidance hole 111 and the second plate avoidance hole 112, and the first plate avoidance hole 111 and the second plate avoidance hole 112 have the distance L1 therebetween. The adjacent substrate avoidance holes 31 are a third substrate avoidance hole 313 and a fourth substrate avoidance hole 314, and the center of the third substrate avoidance hole 313 and the center of the fourth substrate avoidance holes 314 have a distance L3 therebetween. The distance L1 is equal to the distance L3 (i.e., L1=L3).

It can be obtained from the above that L1=L2=L3, and the distances of misalign relative to the light board 20 are equal.

In some embodiments, a maximum dimension D of a cross-section of the support pin 40 is smaller than a dimension D1 of the plate avoidance hole 11 and smaller than a dimension D2 of the substrate avoidance hole 31.

Referring to FIGS. 3A, 3B and 3C, the maximum dimension D of the cross-section of the support pin 40 is a maximum dimension of a bottom surface of the support pin 40. It can be seen from the figures that, the dimension D is less than the dimension D1, and the dimension D is less than the dimension D2. Such size setting may facilitate the support pin 40 to pass through the plate avoidance hole 11 and the substrate avoidance hole 31.

In some embodiments, the dimension D1 of the plate avoidance hole 11 is equal to the dimension D2 of the substrate avoidance hole 31.

Referring to FIG. 3A, the dimension D1 of the plate avoidance hole 11 is equal to the dimension D2 of the substrate avoidance hole 31, (i.e., D1=D2). By setting the two dimensions to be equal, it may facilitate the processing and production of the products, which is high-efficient. In addition, during alternately stacking the light boards 20 and the carrying boards 10, it may be possible to quickly find the benchmark and carry out coordinated laying.

In some embodiments, the plate avoidance hole or the substrate avoidance hole is in a shape of a circle, a square or a polygon.

It will be noted that the plate avoidance hole 11 and the substrate avoidance hole 31 may be set as different shapes. Referring to FIG. 3A, the plate avoidance hole 11 and the substrate avoidance hole 31 are all in a shape of a circle. The above only provides an example of the shapes of the plate avoidance hole 11 and the substrate avoidance hole 31, but the shape of the avoidance hole may also be a square or a polygon, and the shape is not limited thereto.

In some embodiments, at least two adjacent plate avoidance holes 11 in the carrying plate 10 are connected to form an elongated hole 113.

Figure 8:
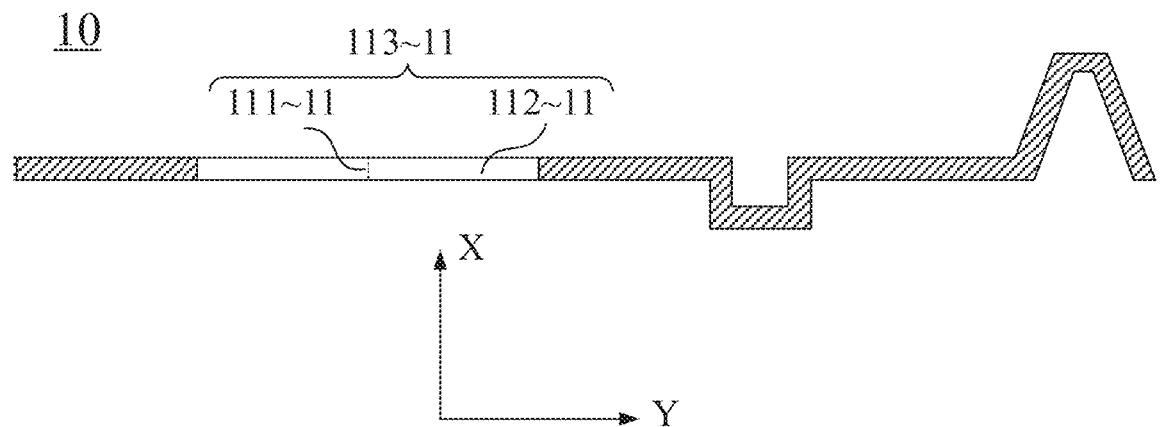
FIG. 8 is a diagram showing a side structure of another carrying plate, in accordance with some embodiments of the present disclosure.

For example, as shown in FIG. 8, the two adjacent plate avoidance holes 11 each has a larger size, but the distance therebetween is 0. That is, the two adjacent plate avoidance holes 11 communicate with each other to form a large elongated hole 113.

In some embodiments, the support pin 40 has a tapered structure. In the second direction X, the size of the support pin 40 gradually becomes narrower.

As shown in FIGS. 3A, 9 and 10, for example, the support pin 40 has a conical-like shape, and an upper surface and an lower surface of the support pin 40 both has a circle. In the second direction X, the size of the support pin 40 gradually narrows. It can be understood that, in the second direction X, that is, along the lower surface to the upper surface of the support pin 40, an outer dimension gradually decrease in a certain proportion.

Some embodiments of the present disclosure further provide a placing method of light board package. The placing method includes placing a first layer of carrying plate 10 as a bottom carrying plate 10, and alternately placing light boards 20 and carrying plates 10 on the bottom carrying plate 10, until a last layer of light board 20 is placed on a last layer of carrying plate 10.

As shown in FIGS. 3A, 5A and 6A, a plurality of carrying plates 10 and a plurality of light boards 20 are arranged alternately in the second direction X. A carrying plate 10 and a light board 20 that are adjacent serve as a group of packaging structure 100, and the light board 20 is disposed on the carrying plate 10. The light board 20 includes a substrate 30 and at least one support pin 40 disposed on the substrate 30.

Each carrying plate 10 is provided with a plurality of plate avoidance holes 11 therein, and each substrate 30 is provided with a plurality of substrate avoidance holes 31 therein.

The positions of the plurality of carrying plates 10 are relatively fixed, and every two adjacent light boards 20 are relatively misaligned. In a group of packaging structure 100, at least one plate avoidance hole 11 and at least one substrate avoidance hole 31 are corresponding and serve as an avoidance hole group 50. In the second direction X, a support pin 40 of a light board 20 in a group of packaging structure 100 located below passes through an avoidance hole group 50 in at least one group of packaging structure 100 located above.

For example, as shown in FIGS. 3A, 5A and 6A, the first layer of carrying plate 10 is placed firstly, the first layer of light board 20 is placed on the first layer of carrying plate, the second layer of carrying plate 10 is placed on a side of the first layer of light board 20 away from the first layer of carrying plate 10, and the support pin 40 of the first layer of light board 20 passes through the plate avoidance hole 11 in the second layer of carrying plate 10.

The second layer of light board 20 is placed on a side of the second layer of carrying plate 10 away from the first layer of carrying plate 10, and the support pin 40 of the first layer of light board 20 passes through the substrate avoidance hole 31 in the second layer of light board 20.

The third layer of carrying plate 10 is placed on a side of the second layer of light board 20 away from the first layer of carrying plate 10, and the support pin 40 of the second layer of light board 20 passes through the plate avoidance hole 11 in the third layer of carrying plate 10.

The third layer of light board 20 is placed on a side of the third layer of carrying plate 10 away from the second layer of carrying plate 10, and the support pin 40 of the second layer of light board 20 passes through the substrate avoidance hole 31 in the third layer of light board 20.

The above-mentioned placing method of light board package is a cycle, and the plurality of carrying plates and the plurality of light boards are alternately stacked in sequence.

The beneficial effects of the light board 20 and the placing method of light board package in the above embodiments of the present disclosure are the same as the beneficial effects of the carrying device 200 in some of the above embodiments, and details are not described here again.

The foregoing descriptions are merely specific implementations of the present disclosure, but the protection scope of the present disclosure is not limited thereto. Any changes or replacements that a person skilled in the art could readily conceive of within the technical scope of the present disclosure shall be included in the protection scope of the present disclosure. Therefore, the protection scope of the present disclosure shall be subject to the protection scope of the claims.

What is claimed is:

1. A whole structure, comprising:
    a plurality of light boards, each light board including:
        a substrate, the substrate being provided with a plurality of substrate avoidance holes therein;
        a plurality of light-emitting elements disposed on the substrate, the plurality of light-emitting elements being arranged in an array on the substrate; and
        at least one support pin disposed on the substrate, wherein in a first direction, at least one substrate avoidance hole is disposed at each of two sides of a support pin of the at least one support pin; and
    a carrying device, the carrying device including a plurality of carrying plates, and each carrying plate in the plurality of carrying plates being used to carry a light board, wherein
    the plurality of carrying plates and the plurality of light boards are alternately arranged in a second direction; every adjacent carrying plate and light board serve as a group of packaging structure, and in the group of packaging structure, the light board is disposed on the carrying plate;
    each carrying plate is provided with a plurality of plate avoidance holes therein;
    positions of the plurality of carrying plates are relatively fixed, and every two adjacent light boards are relatively misaligned; in the group of packaging structure, at least one plate avoidance hole corresponds to at least one substrate avoidance hole, and the at least one plate avoidance hole and the at least one substrate avoidance hole serve as an avoidance hole group; in the second direction, a support pin of a light board in a group of packaging structure located below passes through an avoidance hole group in at least one group of packaging structure located above;
    the second direction is perpendicular to a plane where the light board is located, and the second direction is a direction in which the support pin of the light board is away from the substrate.

2. The whole structure according to claim 1, wherein centers of two substrate avoidance holes respectively at the two sides of the support pin have equal distances to the support pin.

3. The whole structure according to claim 1, wherein the support pin includes a pillar and a base plate that are connected; the base plate is closer to the substrate than the pillar, and the base plate is connected to the substrate.

4. The whole structure according to claim 3, wherein a height of the support pin is in a range of 12 mm to 21 mm, inclusive; and a size of the base plate is in a range of 5 mm to 7 mm, inclusive.

5. The whole structure according to claim 1, wherein
    each carrying plate includes at least one first avoidance area, and at least two plate avoidance holes arranged in the first direction are disposed in a first avoidance area;
    each light board includes at least one second avoidance area, and at least two substrate avoidance holes and one support pin arranged in the first direction are disposed in a second avoidance area; in the first direction, at least one substrate avoidance hole is disposed at each of two sides of the one support pin; and the first avoidance area corresponds to the second avoidance area in the second direction.

6. The whole structure according to claim 5, wherein
    N plate avoidance holes are disposed in the first avoidance area of each carrying plate; and M substrate avoidance holes are disposed in the second avoidance area of each light board;
    in the second direction, the support pin of the light board in the group of packaging structure located below passes through avoidance hole groups in at least L groups of packaging structures located above;
    where N is equal to a sum of L and 1 (N=L+1), and M is equal to twice L (M=2L).

7. The whole structure according to claim 6, wherein two plate avoidance holes are disposed in the first avoidance area of the carrying plate; two substrate avoidance holes are disposed in the second avoidance area of the light board, and the two substrate avoidance holes are respectively disposed at the two sides of the one support pin located in the second avoidance area;
    in the second direction, the support pin of the light board in the group of packaging structure located below passes through an avoidance hole group in one group of packaging structure located above; and in the second direction, the plurality of light boards are arranged in a periodic manner in a group of every two light boards.

8. The whole structure according to claim 6, wherein third plate avoidance holes are disposed in the first avoidance area of the carrying plate; four substrate avoidance holes are disposed in the second avoidance area of the light board, and two substrate avoidance holes are disposed at each of the two sides of the support pin located in the second avoidance area;
   in the second direction, the support pin of the light board in the group of packaging structure located below passes through avoidance hole groups in two groups of packaging structures located above; and
   in the second direction, the plurality of light boards are arranged in a periodic manner in a group of every three light boards.

9. The whole structure according to claim 5, wherein each carrying plate includes a plurality of first avoidance areas disposed in a third direction, and at least two plate avoidance holes arranged in the first direction are disposed in each first avoidance area;
   each light board includes a plurality of second avoidance areas disposed in the third direction, and at least two substrate avoidance holes and one support pin arranged in the first direction are disposed in each second avoidance area;
   in the group of packaging structure, each first avoidance area corresponds to a second avoidance area in the second direction; and
   the third direction intersects the first direction.

10. The whole structure according to claim 5, wherein in the first direction, a distance between centers of two adjacent plate avoidance holes is equal to a distance between a center of the support pin and a center of a substrate avoidance hole adjacent to the support pin.

11. The whole structure according to claim 10, wherein the distance between the centers of the two adjacent plate avoidance holes is equal to a distance between centers of two adjacent substrate avoidance holes, and the two adjacent substrate avoidance holes are provided with no support pin therebetween.

12. The whole structure according to claim 11, wherein a maximum dimension of a cross-section of the support pin is smaller than a dimension of a plate avoidance hole and smaller than a dimension of the substrate avoidance hole.

13. The whole structure according to claim 12, wherein the dimension of the plate avoidance hole is equal to the dimension of the substrate avoidance hole.

14. The whole structure according to claim 1, wherein the plate avoidance hole or the substrate avoidance hole is in a shape of a circle, a square or a polygon.

15. The whole structure according to claim 14, wherein at least two adjacent plate avoidance holes in the carrying plate are connected to be an elongated hole.

16. A placing method of light board package, comprising:
   placing a first layer of carrying plate as a bottom carrying plate, and alternately placing light boards and carrying plates on the bottom carrying plate until a last layer of light board is placed on a last layer of carrying plate, wherein
   a plurality of carrying plates and a plurality of light boards are arranged alternately in a second direction; every adjacent carrying plate and light board serve as a group of packaging structure, and in the group of packaging structure, the light board is disposed on the carrying plate; the light board includes a substrate and at least one support pin disposed on the substrate;
   each carrying plate is provided with a plurality of plate avoidance holes therein, and each substrate is provided with a plurality of substrate avoidance holes therein; and
   positions of the plurality of carrying plates are relatively fixed, and every two adjacent light boards are relatively misaligned; in the group of packaging structure, at least one plate avoidance hole corresponds to at least one substrate avoidance hole, and the at least one plate avoidance hole and the at least one substrate avoidance hole serve as an avoidance hole group; in the second direction, a support pin of a light board in a group of packaging structure located below passes through an avoidance hole group in at least one group of packaging structure located above.

* * * * *